(12) United States Patent
Liebmann et al.

(10) Patent No.: US 7,617,473 B2
(45) Date of Patent: Nov. 10, 2009

(54) DIFFERENTIAL ALTERNATING PHASE SHIFT MASK OPTIMIZATION

(75) Inventors: Lars W. Liebmann, Poughquag, NY (US); Zachary Baum, Gardiner, NY (US)

(73) Assignee: International Business Machines Corporation, Armonk, NY (US)

( * ) Notice: Subject to any disclaimer, the term of this patent is extended or adjusted under 35 U.S.C. 154(b) by 783 days.

(21) Appl. No.: 10/905,822

(22) Filed: Jan. 21, 2005

(65) Prior Publication Data

US 2006/0166105 A1 Jul. 27, 2006

(51) Int. Cl.
G06F 17/50 (2006.01)
(52) U.S. Cl. .............................. 716/19; 716/20; 716/21; 430/5; 430/30
(58) Field of Classification Search ............. 716/19–21; 430/5, 30
See application file for complete search history.

(56) References Cited

U.S. PATENT DOCUMENTS

| 6,503,666 | B1 | 1/2003 | Pierrat |
| 6,553,560 | B2 | 4/2003 | Ma et al. |
| 6,569,583 | B2 * | 5/2003 | Cho et al. ....................... 430/5 |
| 6,573,010 | B2 | 6/2003 | Kling et al. |
| 6,692,876 | B2 | 2/2004 | Baggenstoss |

OTHER PUBLICATIONS

U.S. Appl. No. 10/707,962, filed Jan. 28, 2004 Applicant(s) Lars W. Liebmann, Zachary Baum Title: Alternating Phase Shift Mask Design For High Performance Circuitry Status: Pending.
U.S. Appl. No. 10/707,962, filed Jan. 28, 2004 of Liebmann et al.

* cited by examiner

*Primary Examiner*—Thuan Do
*Assistant Examiner*—Nghia M Doan
(74) *Attorney, Agent, or Firm*—DeLio & Peterson, LLC; Peter W. Peterson

(57) ABSTRACT

A method of designing a mask for projecting an image of an integrated circuit design in lithographic processing, wherein the integrated circuit layout has a plurality of segments of critical width. The method comprises creating a first mask design by aligning mask features used to assist in projecting critical width segments with the critical width segments of the integrated circuit design, such that the first mask design meets predetermined manufacturability design rules, and creating a second mask design by aligning mask features with the critical width segments of the integrated circuit design, such that the second mask design meets predetermined lithographic design rules in regions local to the critical width segments. The method then includes identifying design features of the second mask design that violate the predetermined manufacturability design rules, and then creating a third mask design derived from the second mask design wherein the mask features of the second mask design that violate the predetermined manufacturability rules are selectively replaced by mask features from the first mask design so that the third mask design meets the predetermined manufacturability design rules. By way of example, the mask features used to assist in projecting critical width segments may comprise alternating phase shifting regions or sub-resolution assist features.

7 Claims, 12 Drawing Sheets

DIFFERENTIAL ALTERNATING PHASE SHIFT MASK OPTIMIZATION

BACKGROUND OF THE INVENTION

1. Field of the Invention

The present invention is directed to the manufacture of masks used in the lithographic production of integrated circuits and, in particular, to the manufacture of resolution enhancement technique (RET) enhanced masks, more particularly, to the automated and optimized conversion of IC layouts to RET mask designs

2. Description of Related Art

As an alternative to chrome on glass (COG) masks used in the lithographic production of integrated circuits, alternating phase shifting masks (altPSMs) have been employed in order to increase the resolution of the critical active area patterns projected. Such increased resolution enables smaller line widths and tighter pitches to be exposed on the resist and consequently etched into or deposited on the wafer substrate. The critical dimension (CD) of the system is the smallest dimension that the lithographic system can create with adequate dimensional control on the resist layer by normal techniques, and altPSMs permit sub-CD widths to be exposed and created on the wafer. This is done by manipulating the electric field vector or phase of the energy beam, e.g., visible or ultraviolet light, used in the lithographic process. This phase variation is achieved in PSMs by modifying the length that a light beam travels through the mask material. By recessing the mask to an appropriate depth, light traversing the thinner portion of the mask and light traversing the thicker portion of the masks will be 180° out of phase, that is, their electric field vector will be of equal magnitude, but point in exactly the opposite direction, so that any interaction between these light beams results in perfect cancellation. The benefit of using altPSM to image narrow lines with extremely tight dimensional control has been extensively documented.

One of the major challenges in generating an altPSM layout is to create manufacturable and lithographically viable phase shapes without introducing undue layout conflicts, and without introducing optical proximity errors. Recently, U.S. Pat. No. 7,229,722 has disclosed a globally oriented approach to the design of altPSM layouts. In this approach phase legal and manufacturable layouts are achieved essentially by filling the entire background of the layout pattern with phase shapes, so that the designed phase shapes extend far beyond the primary layout of the circuit and CD features. Details of the phase shape topologies are dictated by the primary layout rather than the details of the altPSM design, so that, for example, a space in the original layout turns into a phase width. While these global approaches to altPSM design avoid costly and often error prone iterative phase legalization, they do not always present the best altPSM design for optical proximity correction (OPC). Extraneous phase shapes employed in the global PSM design approach add to the OPC complexity and may result in unfavorable tradeoffs with critical phase edges that directly impact the patterning of primary layout shapes.

While eliminating many of the phase shapes generated in the global PSM design approaches and focusing on localized PSM solutions generally improves the OPC performance, committing the layout to a localized altPSM design solution brings back all the phase legalization challenges originally avoided by the global PSM design.

SUMMARY OF THE INVENTION

Bearing in mind the problems and deficiencies of the prior art, it is therefore an object of the present invention to provide an improved method for designing phase shifting masks for lithographic production of integrated circuits, particularly altPSMs.

In particular, it is an object of the present invention to provide a method of designing altPSMs that strikes an optimized balance between the efficiency and accuracy benefit of global design solutions and the improved OPC performance of localized altPSM designs.

Another object of the present invention is to extend the benefits of the optimization of global and localized design solutions to other lithographic mask features used to enhance resolution of critical width features, such as sub-resolution assist features (SRAF).

Still other objects and advantages of the invention will in part be obvious and will in part be apparent from the specification.

The above and other objects, which will be apparent to those skilled in art, are achieved in the present invention which is directed to a method of designing a mask for projecting an image of an integrated circuit design in lithographic processing, wherein the integrated circuit layout has a plurality of segments of critical width. The method comprises creating a first mask design by aligning mask features used to assist in projecting critical width segments with the critical width segments of the integrated circuit design, such that the first mask design meets predetermined manufacturability design rules. The method also comprises creating a second mask design by aligning mask features used to assist in projecting critical width segments with the critical width segments of the integrated circuit design, such that the second mask design meets predetermined lithographic design rules in regions local to the critical width segments. The method then includes identifying design features of the second mask design that violate the predetermined manufacturability design rules, and then creating a third mask design derived from the second mask design wherein the mask features of the second mask design that violate the predetermined manufacturability rules are selectively replaced by mask features from the first mask design so that the third mask design meets the predetermined manufacturability design rules.

By way of example, the mask features used to assist in projecting critical width segments may comprise alternating phase shifting regions or sub-resolution assist features. Preferably, the second mask design comprises a subset of the first mask design. The third mask design may then be used to transfer an image of the integrated circuit design to a substrate.

Where alternating phase shifting regions are used as the mask features, the predetermined manufacturability design rules may comprise minimum phase width and minimum phase-to-phase spacing and the predetermined lithographic design rules may comprise process window considerations.

Where the mask features are sub-resolution assist features, the predetermined manufacturability design rules may comprise SRAF size and spacing and the predetermined lithographic design rules may comprise process window considerations.

In another aspect, the present invention is directed to a method of designing an alternating phase shifting mask for projecting an image of an integrated circuit design layout having a plurality of segments of critical width comprising creating a first mask design of an alternating phase shifting mask by aligning alternating phase shifting regions with the critical width segments, and extending the alternating phase shifting regions beyond ends of at least some of the critical width segments to which they are aligned and to meet predetermined manufacturability design rules. The method also includes creating a second mask design of an alternating phase shifting mask by aligning alternating phase shifting regions with the critical width segments without extending pairs of the alternating phase shifting regions substantially beyond ends of the critical width segments to which they are aligned. The method then includes identifying design features of the second mask design that violate the predetermined manufacturability design rules, and creating a third mask design derived from the second mask design. In the third mask design, the design features of the second mask design that violate the predetermined manufacturability rules are selectively replaced by design features from the first mask design so that the third mask design meets the predetermined manufacturability design rules.

The predetermined manufacturability design rules may comprise minimum phase width and minimum phase-to-phase spacing and the predetermined lithographic design rules may comprise process window considerations. The second mask design of the alternating phase shifting mask typically violates at least one manufacturing design rule comprising minimum phase width and minimum phase-to-phase spacing. The third mask design is then used to transfer an image of the integrated circuit design to a substrate.

A further aspect of the present invention is directed to a method of designing a photo mask for projecting an image of an integrated circuit design layout having a plurality of segments of critical width comprising creating a first mask design of a photo mask by aligning sub-resolution assist features (SRAFs) with the critical width segments, such that the first mask design meeting predetermined manufacturability design rules, and creating a second mask design of a photo mask by aligning sub-resolution assist features with the critical width segments, such that the second mask design meets predetermined lithographic design rules in regions local to the critical width segments. The method then includes identifying design features of the second mask design that violate the predetermined manufacturability design rules, and creating a third mask design derived from the second mask design, wherein the design features of the second mask design that violate the predetermined manufacturability rules are selectively replaced by design features from the first mask design so that the third mask design meets the predetermined manufacturability design rules.

The predetermined manufacturability design rules may comprise SRAF size and spacing, and the predetermined lithographic design rules may comprise process window considerations. Typically, the second mask design violates at least one predetermined manufacturing design rule comprising SRAF size and spacing. The third mask design is then used to transfer an image of the integrated circuit design to a substrate.

Yet another aspect of the present invention is directed to a program storage device, readable by a machine, which tangibly embodying a program of instructions executable by the machine to perform any of the previously described method steps for designing a mask for projecting an image of an integrated circuit design having a plurality of segments of critical width.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-12 of the drawings in which like numerals refer to like features of the invention.

In one preferred embodiment of the present invention, there is initially designed a global altPSM design, based on the teachings of the aforementioned U.S. Pat. No. 7,229,722, the disclosure of which is hereby incorporated by reference.

Figure 1:
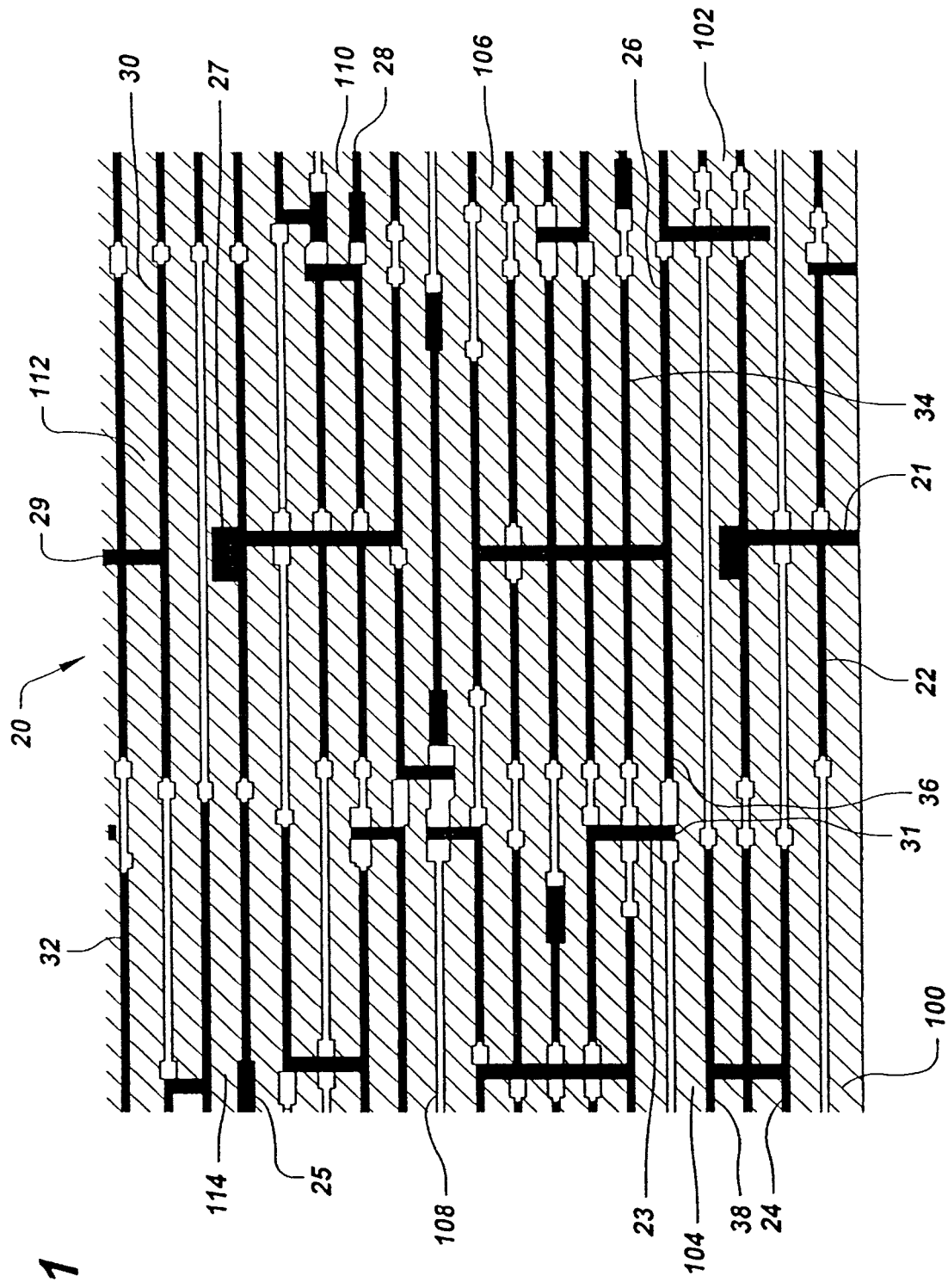
FIG. 1 is a top plan view of an integrated circuit layout with critical width segments with a global altPSM design in which alternating phase shifting regions extend beyond the ends of the critical width segments to which they are aligned.

As shown in FIG. 1, critical width segments of an integrated circuit layout 20, for example those identified as even numbered segments 22-38, have a plurality of essentially parallel segments oriented horizontally. As used herein, the term critical segment refers to segments, or portions thereof, that have a critical dimension, i.e., a dimension smaller than the smallest dimension that the lithographic system can create with adequate dimensional control on the resist layer. Also in FIG. 1 are non-critical segments of the integrated circuit layout, for example those shown as odd numbered segments 21-31, having a greater width than the critical segments. The centerline spacing of the critical segments, in a vertical direction, is preferably an integer multiple of the minimum pitch of the circuit layout. The original critical width segments are extended, for PSM design purposes only, preferably out to any boundaries (not shown) around the integrated circuit layout. Thereafter, alternating phase shifting regions, for example those identified as even numbered regions 100-114, are created between the extended critical width segments. Thus, the alternating phase shifting regions extend beyond the ends of at least some, and perhaps all, of the original critical width segments to which they are aligned.

Figure 2:
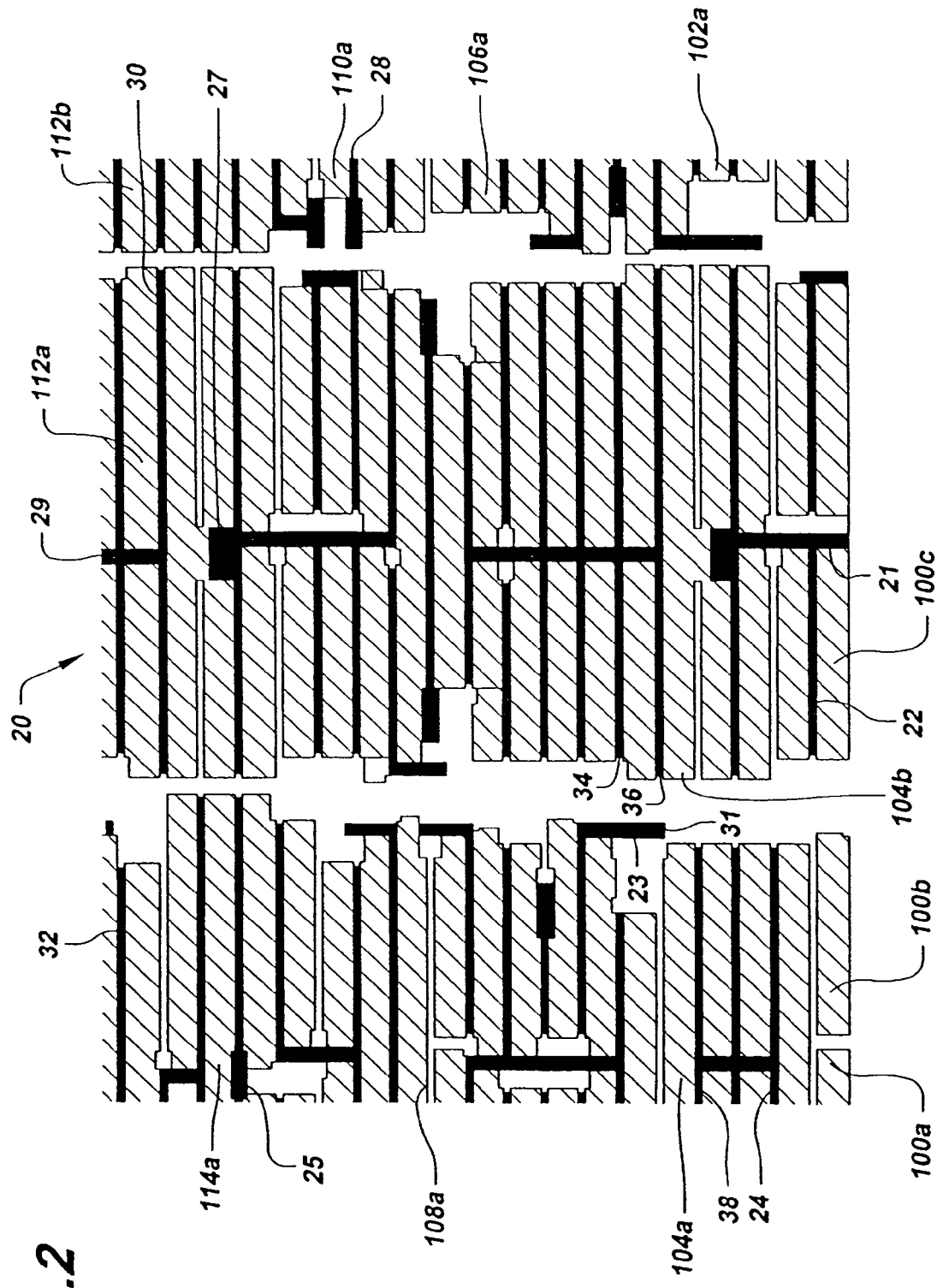
FIG. 2 is a is a top plan view of the integrated circuit layout of FIG. 1 with a localized altPSM design in which alternating phase shifting regions do not extend substantially beyond the ends of the critical width segments to which they are aligned.

The present invention also preferably generates a rough localized altPSM design in addition to the global altPSM design of FIG. 1. FIG. 2 depicts the localized altPSM solution for the same critical width segments of the integrated circuit layout shown in FIG. 1. In this approach, the alternating phase shifting regions are created on opposite sides of, i.e., above and below, the original critical width segments. This rough localized altPSM design fulfills predetermined lithographic design rules, such as the process window lithography requirements for the altPSM shapes to provide a range of acceptable dose and focus parameters, or lithographic resolution requirements such as continuous coverage of critical layout edges by phase shapes, minimum distance of inside phase edges to outside critical edges (nominal phase width), or minimum extension of phase shapes past line ends. However, these rough localized altPSM shapes do not necessarily obey all manufacturability constraints or alternating phase shift design rules based on alternating phase shift design parameters such as minimum phase to phase space or minimum phase width.

Figure 3:
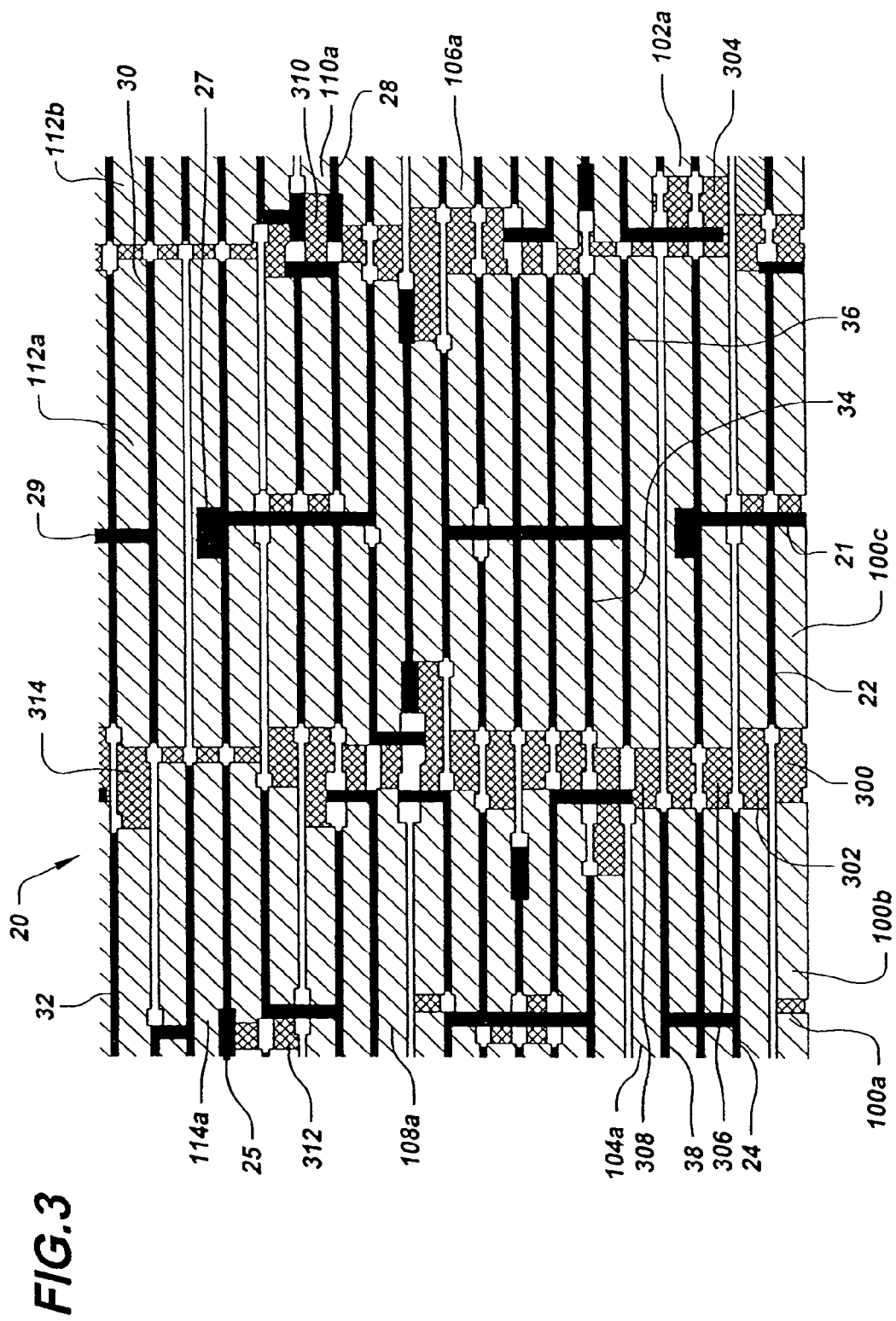
FIG. 3 is a top plan view of the integrated circuit layout of FIG. 1 showing the difference shapes between the alternating phase shifting regions of FIGS. 1 and 2.
Figure 4:
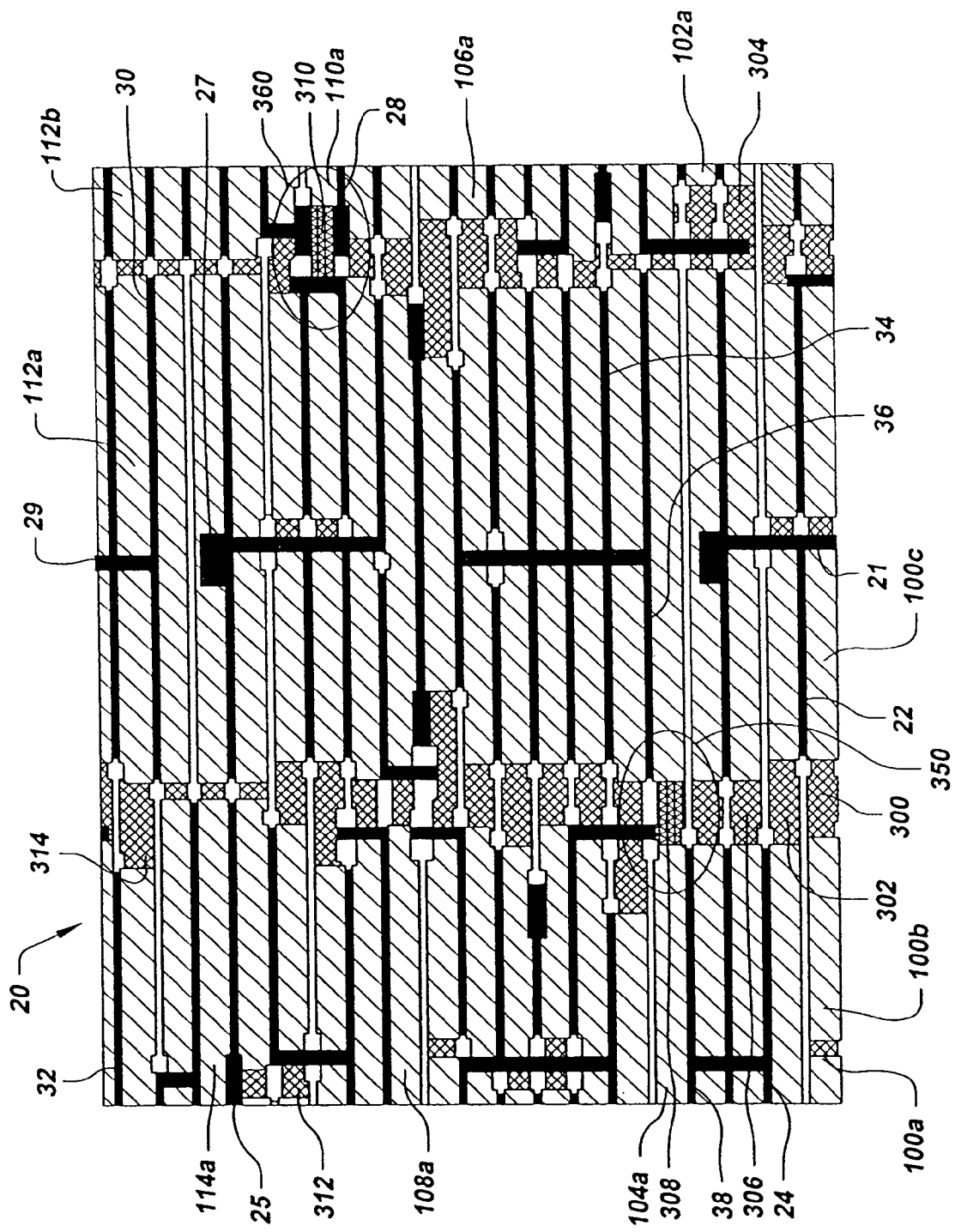
FIG. 4 is a top plan view showing the difference shapes of FIG. 3 that present manufacturability concerns.

The next step in the preferred method of the present invention is to calculate or identify the difference between the global altPSM design of FIG. 1, which is generally considered to be manufacturing clean but not OPC optimized, and the localized altPSM design of FIG. 2, which is considered OPC optimized but potentially unmanufacturable. The difference between the global and local altPSM layouts is readily derived by a logic "not" command, commonly referred to as a subtraction. As shown in FIG. 3, cross-hatched regions or shapes, for example those even numbered shapes identified as 300-314, show the difference between the global and local altPSM solutions.

In accordance with the present invention, the task of striking an optimized balance between OPC-optimization and altPSM manufacturability now reduces to choosing which difference shapes of FIG. 3 to keep and which to remove. Specifically, in this example, where the goal is to ultimately generate a layout closely resembling the localized PSM design, the optimization task is reduced to identifying difference shapes which can not be removed from the manufacturable global layout without introducing manufacturability violations, i.e., violations of alternating phase shift design rules based on the aforementioned or other alternating phase shift design parameters. Simple first order manufacturability violations such as sub-minimum phase-width or phase-space can be readily identified in the localized phase shift design. Difference shapes in the vicinity of such primary manufacturability violations are tagged or designated as non-removable. In addition to these primary manufacturability concerns, secondary problems such as the inability to derive a manufacturing legal block mask from the generated phase shapes as detailed below, can be captured in the tagging of the difference shapes as not-removable. Ultimately, all manufacturability concerns lead to a subset of the difference shapes that should be kept in the final layout to ensure manufacturability. These are shown in the encircled regions 350 and 360 of FIG. 4, which depicts difference shapes 308 and 310 that are associated with manufacturability concerns in the localized phase shift design.

Figure 5:
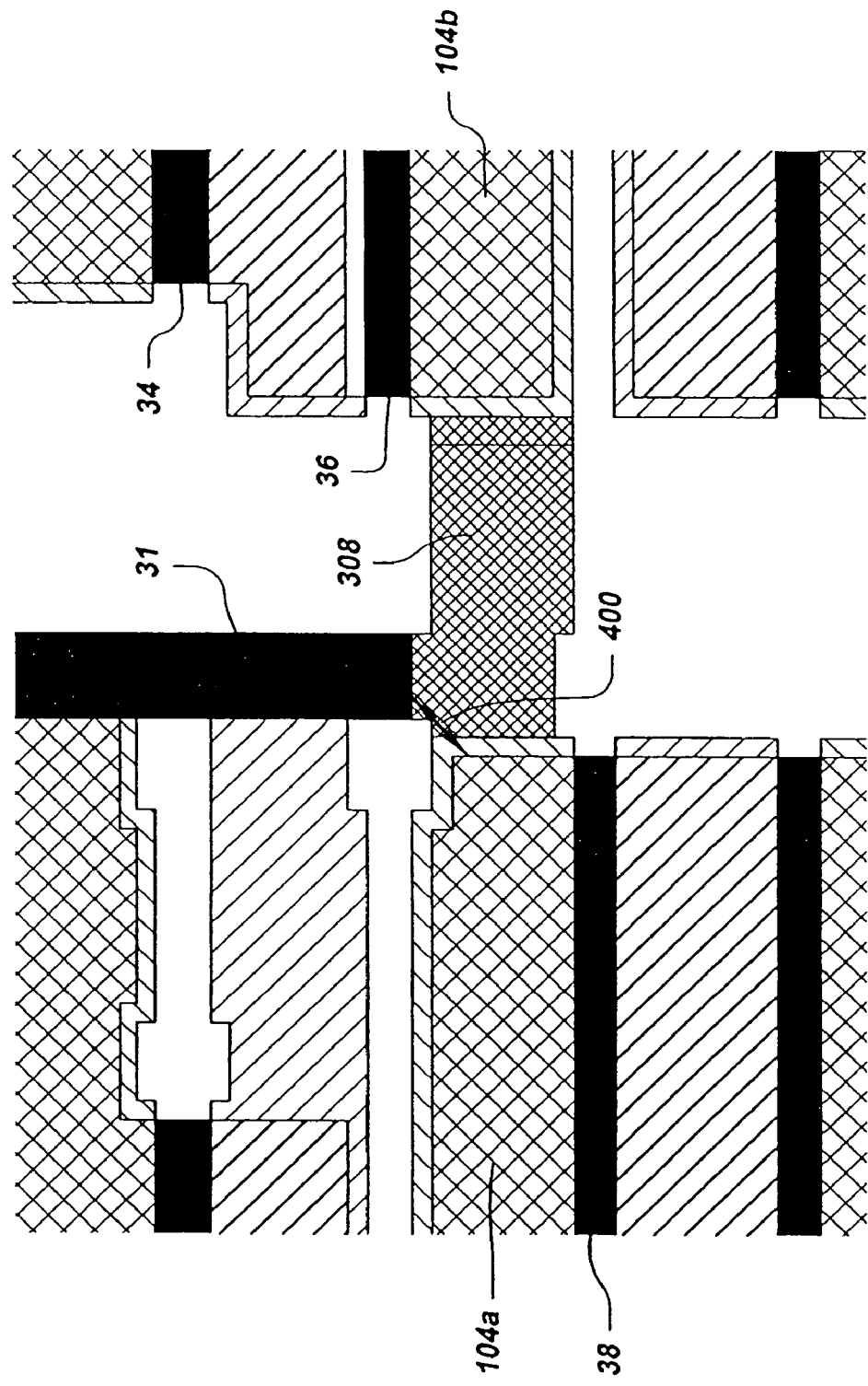
FIG. 5 is a close up of one of the difference shapes of FIG. 4 showing a space violation.

The streamlined altPSM layout optimization approach described herein allows for the avoidance of manufacturability concerns not only on the primary resolution enhancement technique (RET) design, in this case the phase shapes, but also on derived RET shapes, in this case the block patterns. By deriving a crude block mask design from the rough localized phase shapes (in this example by simply shrinking the combined phase and poly layout and adding the original poly layout), manufacturability concerns such as the minimum space violations can be identified and avoided by tagging the difference shapes in the vicinity of the violation as non-removable. FIG. 5 depicts an approximation of the final block mask design in the vicinity of difference shape 308. This derived approximation is sufficiently accurate to conservatively identify manufacturability concerns such as the space violation shown by arrow 400 at the upper left corner of difference shape 308.

Figure 6:
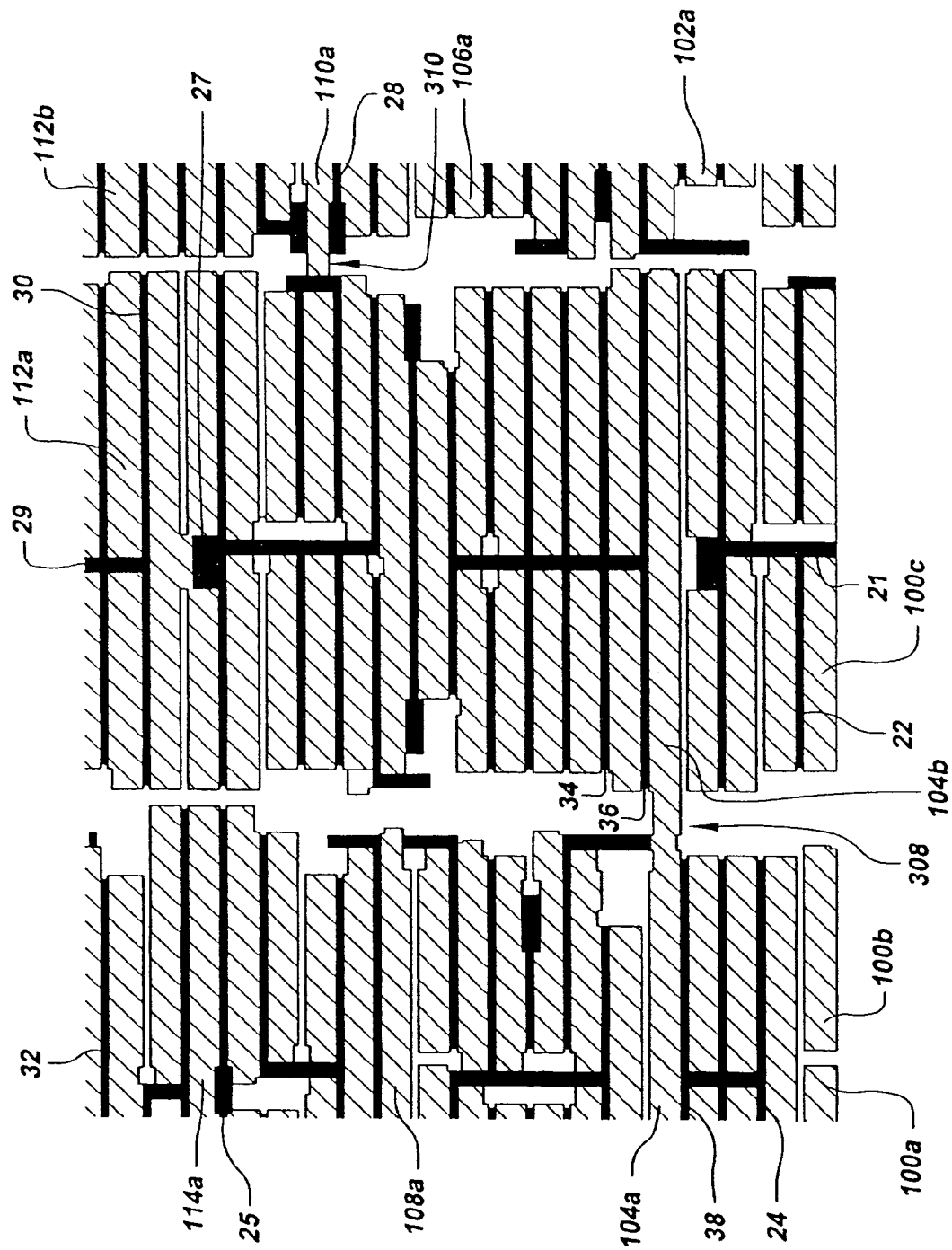
FIG. 6 is a top plan view of the combination of all difference shapes that have been designated as non-removable with the alternating phase shifting regions of FIG. 1, prior to assignment of the final phase identity.
Figure 7:
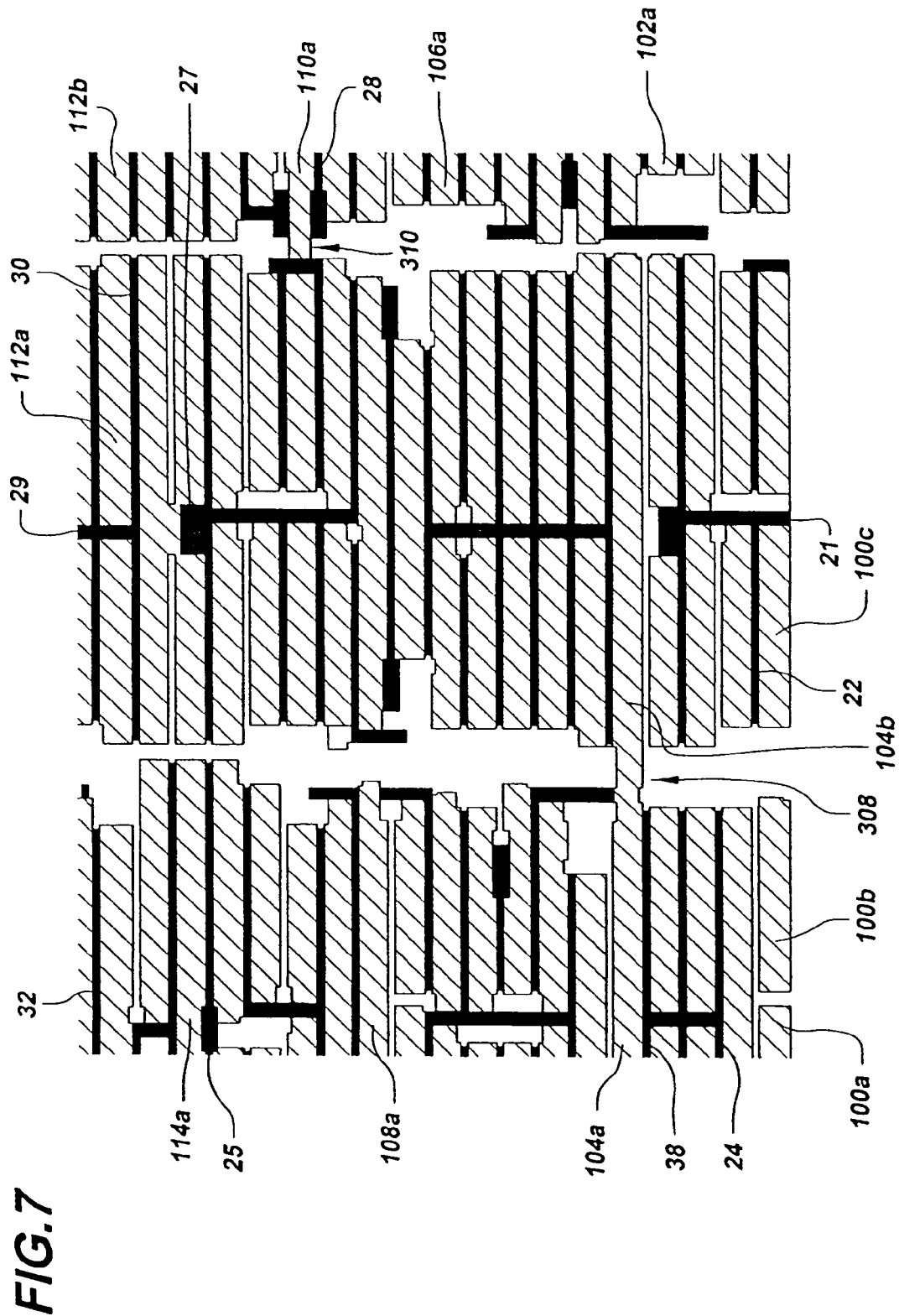
FIG. 7 is a top plan view of the combination of all difference shapes that have been designated as non-removable with the alternating phase shifting regions of FIG. 1, after to assignment of the final phase identity.

The optimized altPSM layout pursuant to the present method is then generated by removing all difference shapes that have not been tagged as non-removable (FIG. 4) from the original global altPSM design (FIG. 1). FIG. 6 depicts the final altPSM layout prior to coloring, i.e., assignment of phases, and including phase shifting regions for non-removable difference shapes 308 and 310. FIG. 7 depicts the final altPSM layout with alternating phase assignments.

In practicing the method of the present invention on a RET-compliant layout (i.e. a layout for which a legal RET solution is know to exist), there is generated one RET solution which is known to be fully manufacturable (i.e., free of any manufacturability rule violations), and a second RET solution which optimizes certain aspects of the lithography process such as process window or ability to achieve OPC (i.e., good image fidelity after OPC due to a favorable alignment of the RET layout shapes with the specific OPC functionality). Thereafter, the difference between the two solutions is established, preferably with some filtering to eliminate insignificant differences such as small slivers, and those difference shapes that are associated with manufacturability concerns are identified in the second RET solution. The final optimized RET layout is then generated by combining the second, litho optimized, RET layout with the difference shapes that would render the RET layout unmanufacturable if left out of the design.

Figure 8:
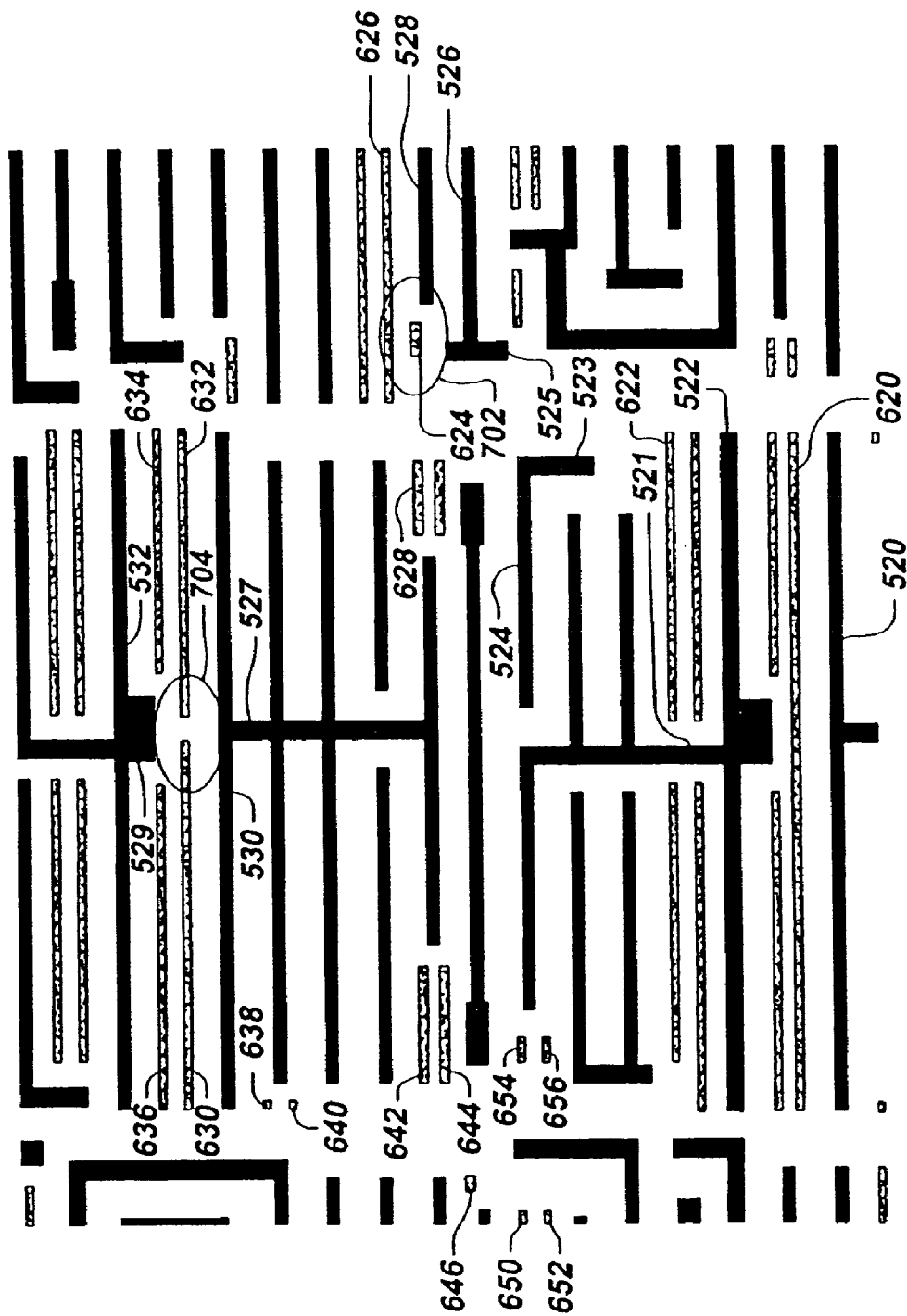
FIG. 8 is a top plan view of a photo mask design for an integrated circuit layout with critical width segments and sub-resolution assist features that meet localized design concerns.
Figure 9:
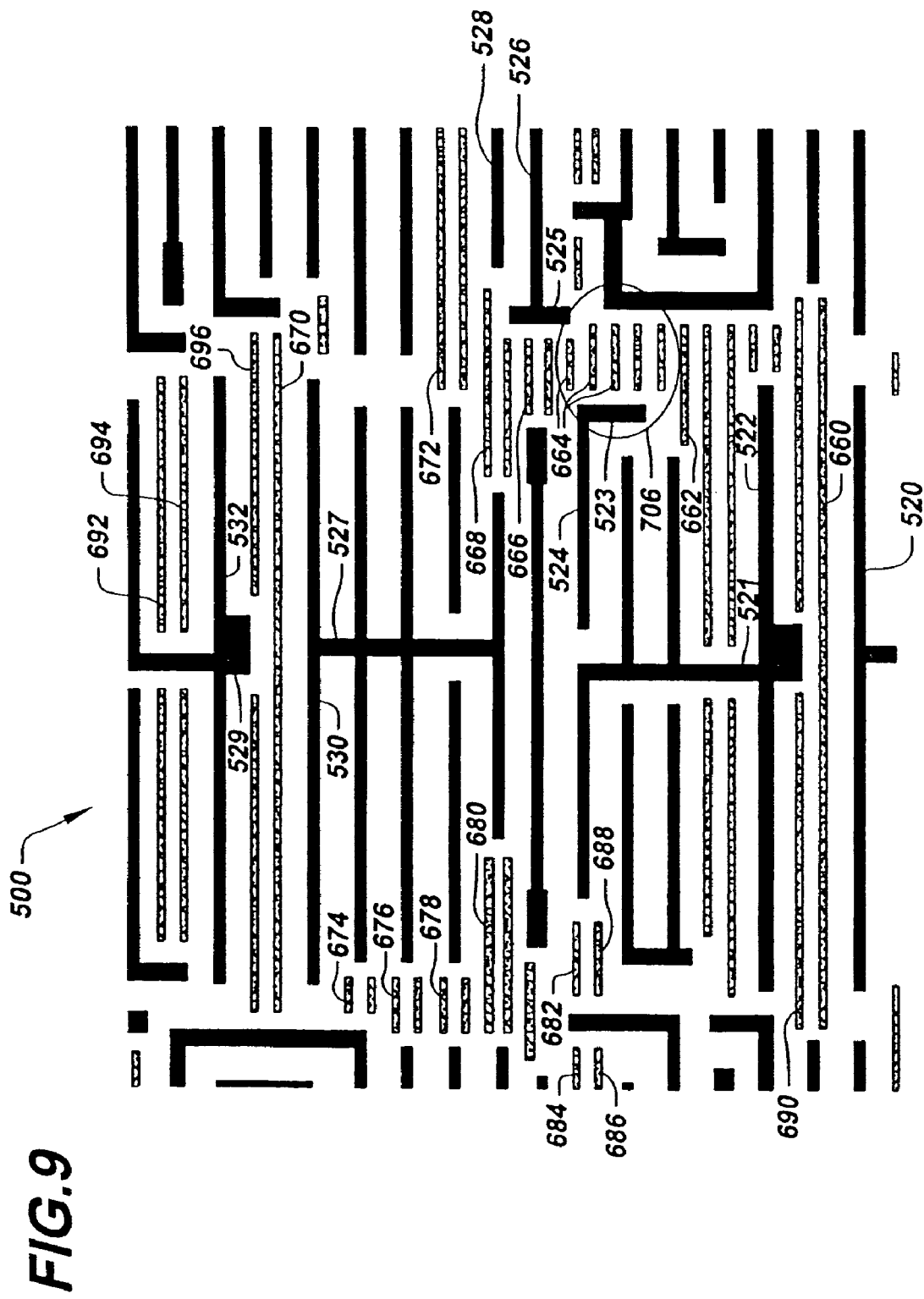
FIG. 9 is a top plan view of a photo mask design for the integrated circuit layout of FIG. 8 with critical width segments and sub-resolution assist features that meet global manufacturability design rules.
Figure 10:
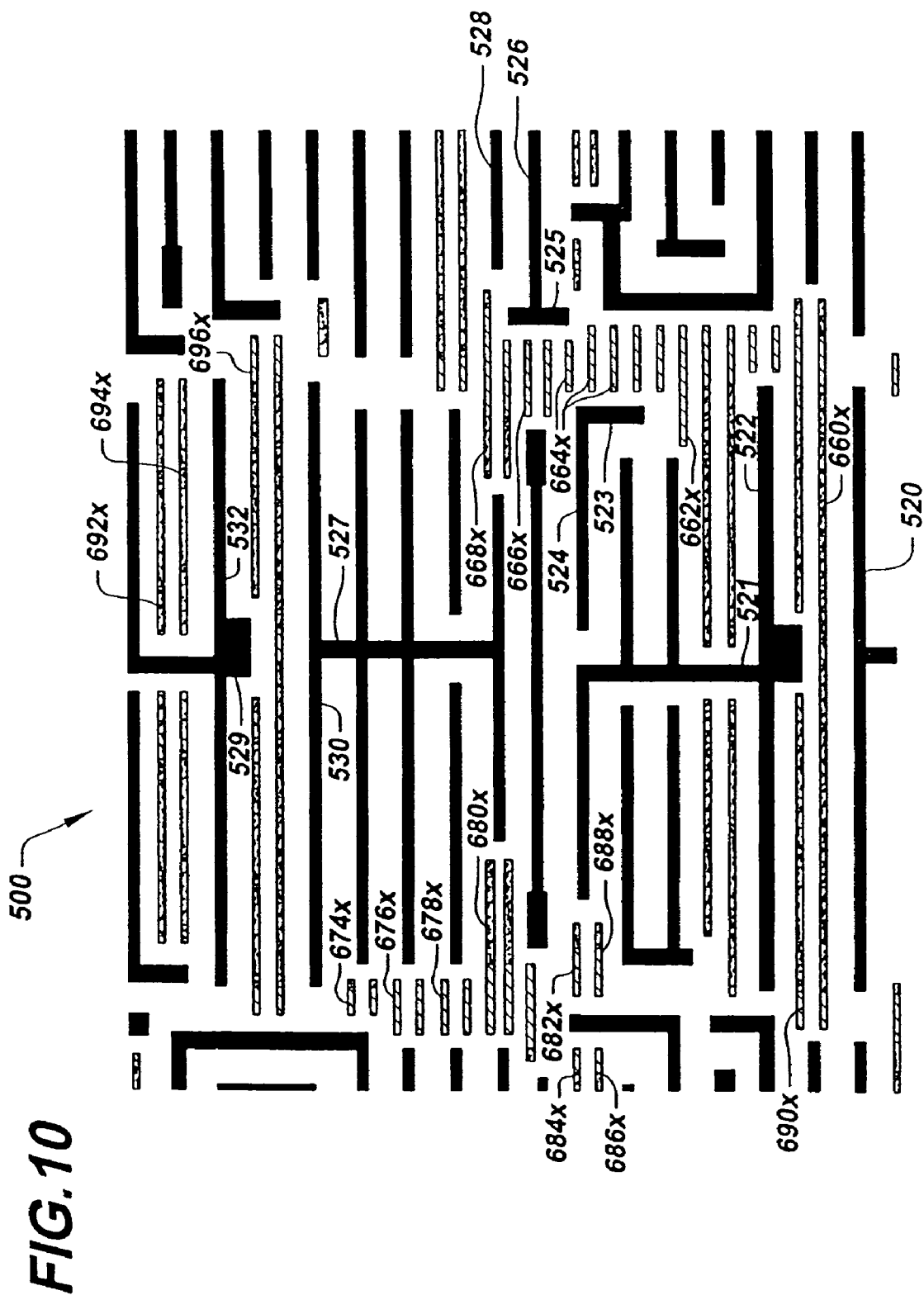
FIG. 10 is a top plan view showing the difference in sub-resolution assist features between the local solution of FIG. 8 and the global solution of FIG. 9.
Figure 11:
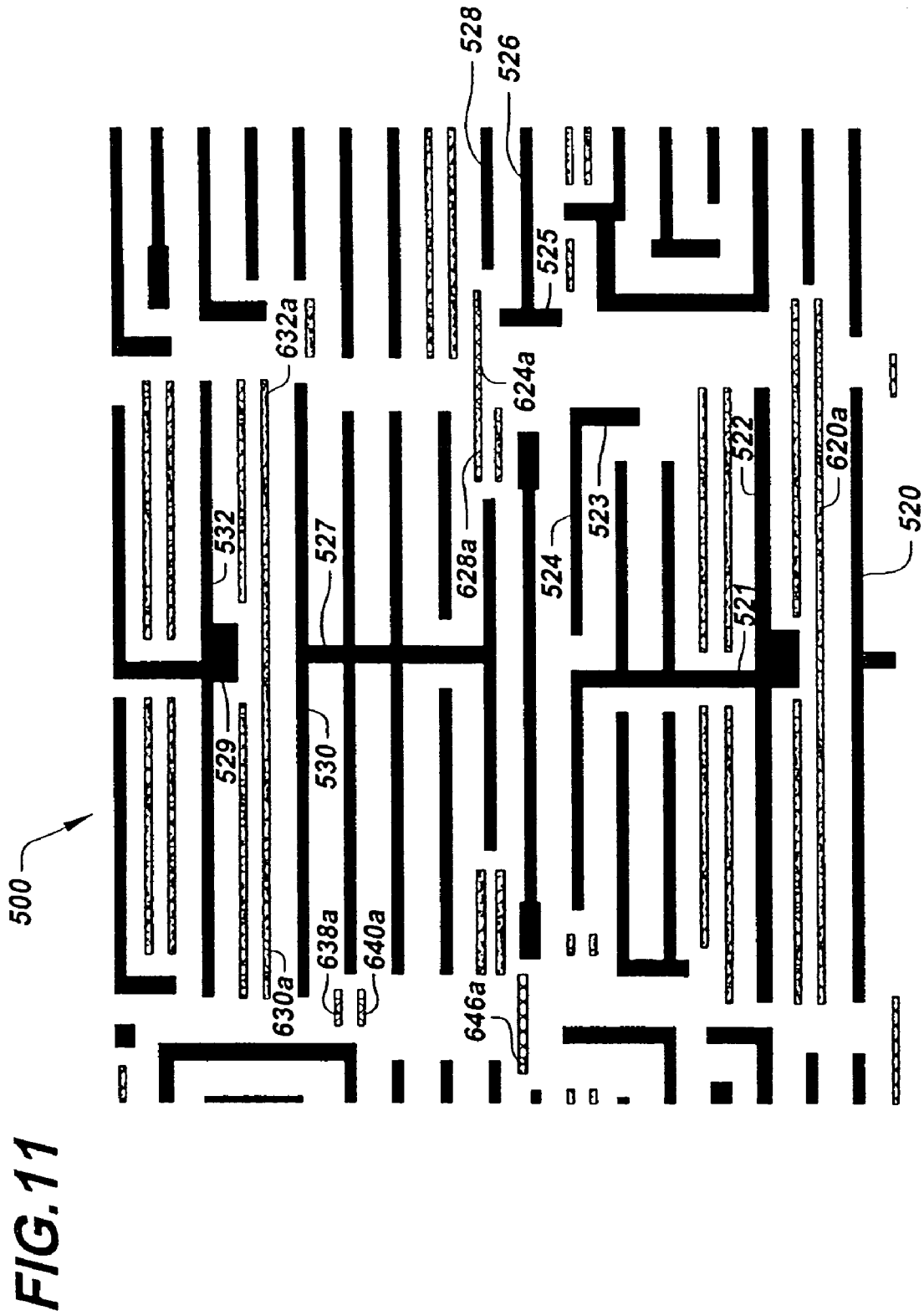
FIG. 11 is a top plan view showing the selective addition of sub-resolution assist feature differences between the local and global solutions to the local solution mask design of FIG. 8.

The alternating phase shifting regions described in connection with FIGS. 1-7 represent one type of feature used on a mask to assist in lithographic projection of critical width segments. The RET optimization approach described herein specifically for alternating phase shifted mask lithography can be broadly applied to a variety of layout manipulating RETs. One example of such RET is the use of sub-resolution assist features (SRAF), also known in the art as scattering bars, which when used on photo masks in conjunction with off-axis illumination can achieve resolution enhancement similar to that of alternating phase shifted mask lithography. As illustrated in FIGS. 8-11, two SRAF design solutions can be derived for an exemplary polysilicon conductor layout 500 shown as solid lines. The conductors of the integrated circuit design shown include critical segments, for example, even numbered segments 520-532, as well as non-critical segments, for example, odd numbered segments 521-529. Using techniques analogous to those discussed in connection with the localized altPSM design of FIG. 2, localized SRAF solution segments to be created on the photo mask in conjunction with the segments of the conductor layout, for example, even numbered SRAFs 620-656, are generated on a portion of the layout, i.e., only in the immediate vicinity of critical design elements. These SRAFs represent a rough or bare minimum RET design. The localized solution is optimized locally to meet predetermined lithographic design criteria, such as process window considerations, i.e., to provide a larger range of acceptable dose and focus parameters for the lithographic processing, so as to enhance resolution of critical features where tolerances are tighter and dimensions are smaller. In the example depicted, the SRAFs are optimized from an overall shapes count and data-volume perspective. However, this localized SRAF solution often encounters manufacturability issues such as SRAFs that are too small or SRAFs that are too tightly spaced. As shown in FIG. 8, according to the predetermined manufacturability design rules, SRAF 624 in circled area 702 is too small, and SRAFs 630 and 632 are too closely spaced in circled area 704. These and other manufacturability rules may be determined by conventional photolithographic manufacturing criteria. On the other hand, as shown in FIG. 9, the global SRAF solution produces a very manufacturable solution that meets predetermined manufacturability rules, for example, even numbered SRAFs 660-696. However, the illustrated global solution of FIG. 9 burdens the mask design with excessive numbers of additional mask patterns, such as SRAFs 664 shown as circled area 706. By identifying the difference between the local and global RET solutions, shown in FIG. 10 as diagonally hatched SRAFs, for example in SRAF portions designated with the suffix "x," and applying simple manufacturability-based selection criteria, an optimized compromise between the efficient local SRAF and the manufacturable global solution can be found by selectively adding the difference between the local and global solutions to the local solution mask design. This is shown in FIG. 11 as, for example, the SRAFs designated with the suffix "a."

Figure 12:
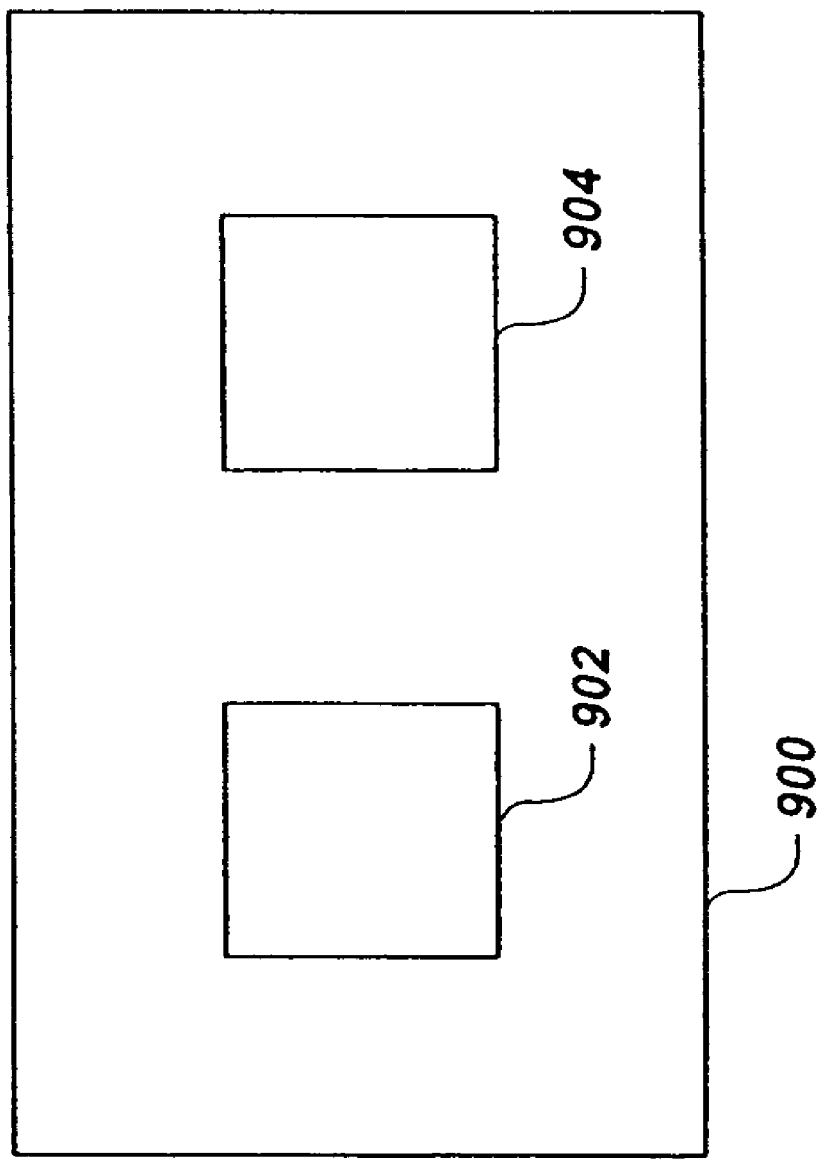
FIG. 12 is a schematic of an electronic design automation tool or program storage device for storing the code to execute the method of the present invention.

The methods of the present invention for designing masks used in lithographic projection may be implemented by a computer program or software incorporating the process steps and instructions described above in otherwise conventional program code and stored on an electronic design automation (EDA) tool or an otherwise conventional program storage device 900 as shown in FIG. 12. The program code, as well as any input information required, may be stored in the EDA tool or computer on a program storage device 902, such as a semiconductor chip, a read-only memory, magnetic media such as a diskette or computer hard drive, or optical media such as a CD or DVD ROM. The EDA tool or computer system has a microprocessor 904 for reading and executing the stored program code in device in the manner described above.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of designing a mask for projecting an image of an integrated circuit design in lithographic processing comprising:

providing a design of an integrated circuit layout having a plurality of segments of critical width;

creating a first mask design using a computer system, by aligning mask features of alternating phase shifting regions or sub-resolution assist features (SRAFs) used to assist in projecting critical width segments with the critical width segments of the integrated circuit design, the first mask design meeting predetermined manufacturability design rules comprising process window considerations, minimum phase width and minimum phase-to-phase spacing or SRAF size and spacing;

creating a second mask design using the computer system, by aligning mask features of alternating phase shifting regions or sub-resolution assist features (SRAFs) used to assist in projecting critical width segments with the critical width segments of the integrated circuit design, the second mask design meeting predetermined lithographic design rules in regions local to the critical width segments, the second mask design comprising a subset of the first mask design;

identifying design features of the second mask design that violate the predetermined manufacturability design rules;

creating a third mask design using the computer system, derived from the second mask design wherein the mask features of the second mask design that violate the predetermined manufacturability rules are selectively replaced by mask features from the first mask design so that the third mask design meets the predetermined manufacturability design rules.

2. The method of claim 1 further including using the third mask design to transfer an image of the integrated circuit design to a substrate.

3. A method of designing an alternating phase shifting mask for projecting an image of an integrated circuit design comprising:

providing a design of an integrated circuit layout having a plurality of segments of critical width;

creating a first mask design of an alternating phase shifting mask using a computer system, by aligning alternating phase shifting regions with the critical width segments and extending the alternating phase shifting regions beyond ends of at least some of the critical width segments to which they are aligned and meeting predetermined manufacturability design rules comprising process window considerations or minimum phase width and minimum phase-to-phase spacing;

creating a second mask design of an alternating phase shifting mask using the computer system, by aligning alternating phase shifting regions with the critical width segments without extending pairs of the alternating phase shifting regions substantially beyond ends of the critical width segments to which they are aligned, the second mask design violating at least one manufacturing design rule comprising minimum phase width and minimum phase-to-phase spacing;

identifying design features of the second mask design that violate the predetermined manufacturability design rules;

creating a third mask design derived from the second mask design using the computer system, wherein the design features of the second mask design that violate the predetermined manufacturability rules are selectively replaced by design features from the first mask design so that the third mask design meets the predetermined manufacturability design rules.

4. The method of claim 3 further including using the third mask design to transfer an image of the integrated circuit design to a substrate.

5. A method of designing a photo mask for projecting an image of an integrated circuit design comprising:

providing a design of an integrated circuit layout having a plurality of segments of critical width;

creating a first mask design of a photo mask using a computer system, by aligning sub-resolution assist features (SRAFs) with the critical width segments, the first mask design meeting predetermined manufacturability design rules comprising process window considerations or SRAF size and spacing;

creating a second mask design of a photo mask using the computer system, by aligning sub-resolution assist features with the critical width segments, the second mask design meeting predetermined lithographic design rules comprising process window considerations in regions local to the critical width segments, the second mask design violating at least one predetermined manufacturing design rule comprising SRAF size and spacing;

identifying design features of the second mask design that violate the predetermined manufacturability design rules;

creating a third mask design derived from the second mask design using the computer system, wherein the design features of the second mask design that violate the predetermined manufacturability rules are selectively replaced by design features from the first mask design so that the third mask design meets the predetermined manufacturability design rules.

6. The method of claim 5 further including using the third mask design to transfer an image of the integrated circuit design to a substrate.

7. A program storage device readable by a machine, tangibly embodying a program of instructions executable by the machine to perform method steps for designing a mask for projecting an image of an integrated circuit design, the integrated circuit design layout having a plurality of segments of critical width, said method steps comprising:

creating a first mask design of a mask by aligning mask features of alternating phase shifting regions or sub-resolution assist features (SRAFs) used to assist in projecting critical width segments with the critical width segments of the integrated circuit design, the first mask design meeting predetermined manufacturability design rules comprising process window considerations, minimum phase width and minimum phase-to-phase spacing or SRAF size and spacing;

creating a second mask design of a mask by aligning mask features of alternating phase shifting regions or sub-resolution assist features (SRAFs) used to assist in projecting critical width segments with the critical width segments of the integrated circuit design, the second mask design meeting predetermined lithographic design rules in regions local to the critical width segments;

identifying design features of the second mask design that violate the predetermined manufacturability design rules;

creating a third mask design derived from the second mask design wherein the mask features of the second mask design that violate the predetermined manufacturability rules are selectively replaced by mask features from the first mask design so that the third mask design meets the predetermined manufacturability design rules.

* * * * *

UNITED STATES PATENT AND TRADEMARK OFFICE
CERTIFICATE OF CORRECTION

PATENT NO. : 7,617,473 B2 Page 1 of 1
APPLICATION NO. : 10/905822
DATED : November 10, 2009
INVENTOR(S) : Liebmann et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1257 days.

Signed and Sealed this

Nineteenth Day of October, 2010

David J. Kappos
*Director of the United States Patent and Trademark Office*